(12) United States Patent
Murakami et al.

(10) Patent No.: US 6,864,514 B2
(45) Date of Patent: Mar. 8, 2005

(54) LIGHT EMITTING DIODE

(75) Inventors: Tetsuroh Murakami, Tenri (JP);
Hiroshi Nakatsu, Mihara (JP);
Takahisa Kurahashi, Kashiba (JP);
Shouichi Ohyama, Soraku-gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/727,723

(22) Filed: Dec. 3, 2003

(65) Prior Publication Data
US 2004/0113170 A1 Jun. 17, 2004

(30) Foreign Application Priority Data

Dec. 17, 2002 (JP) ........................................ 2002-365365

(51) Int. Cl.$^7$ ............................................. H01L 29/24
(52) U.S. Cl. ............................ 257/103; 257/79; 438/22
(58) Field of Search .................. 257/79, 103, E25.032, 257/E51.022; 438/22

(56) References Cited

U.S. PATENT DOCUMENTS

| 5,952,778 A | * | 9/1999 | Haskal et al. ............... 313/504 |
| 2002/0013008 A1 | * | 1/2002 | Sanaka et al. ................ 438/15 |
| 2003/0059972 A1 | * | 3/2003 | Ikeda et al. .................... 438/47 |

FOREIGN PATENT DOCUMENTS

| JP | 11-004020 | 1/1999 |
| JP | 11-017220 | 1/1999 |

* cited by examiner

*Primary Examiner*—Nathan J. Flynn
*Assistant Examiner*—Scott R. Wilson
(74) *Attorney, Agent, or Firm*—Morrison & Foerster LLP

(57) ABSTRACT

A light emitting diode having, at least, an AlGaInP light emitting layer and a transparent electrode, wherein the transparent electrode is made of a ZnO film doped with a group III element or a compound thereof.

10 Claims, 5 Drawing Sheets

LIGHT EMITTING DIODE

CROSS-REFERENCE TO RELATED APPLICATION

This application is related to Japanese Patent Application No. 2002-365365 filed on Dec. 17, 2002, whose priority is claimed under 35 USC §119, the disclosure of which is incorporated by reference in its entirety.

BACKGROUND OF THE INVENTION

1. Field of the Invention

The present invention relates to a light emitting diode that is widely used for a display and the like and that has, at least, an AlGaInP light emitting layer and a transparent electrode.

2. Description of the Related Art

A light emitting diode is widely used as a device of, for example, a display, an optical fiber communication apparatus and the like. In general, required is the light emitting diode with high luminance (high output), which is excellent in light emitting efficiency and response characteristics. Furthermore, cost reduction of the products equipped with a light emitting diodes has progressed in recent years and, therefore, cost reduction is required for the light emitting diode which is a part of such products.

A variation in the color of emitted light, in addition to high luminance, is required for a light emitting diode used as a display device. Thus, a device using AlGaInP as a constituent material of a light emitting layer, emits light ranging from green to red depending on the composition ratio thereof, and is widely used. Moreover, devices having a variety of structures in addition to devices made of a variety of materials have developed in order to attain devices with higher luminance.

FIG. 1 is a schematic cross-sectional view showing an example of a conventional light emitting diode. This light emitting diode is formed on a first conductive type substrate 11 having a lower layer electrode 112 on its rear surface by sequentially laminating a first conductive type buffer layer 12, a first conductive type DBR (Distributed Bragg Reflector) layer 13, a first conductive type clad layer 14, a second conductive type light emitting layer (also referred to as "active layer") 15, a second conductive type clad layer 16, a second conductive type first contact layer (absorptive GaAs) 17 for a transparent electrode, a first conductive type current blocking layer 18, a second contact layer (Zn layer) 19, a first conductive type transparent electrode (ITO film) 110 and an electrode (also referred to as "bonding pad") 111 for wire bonding. Thus, this light emitting diode has the second conductive type light emitting layer 15 of a double-hetero structure, thereby increasing the light emitting efficiency; is provided with the first conductive type current blocking layer 18, thereby preventing the emitted light from being absorbed by the bonding pad; and is provided with the first conductive type transparent electrode 110 on the entirety of the surface of the device, thereby making the diffusion of current to be good and preventing the light emitting efficiency from being lowered due to the current concentration (see, for example, Japanese Unexamined Patent Publication No.HEI 11(1999)-4020 and Japanese Patent Gazette 3084364).

According to the above conventional art, however, absorptive GaAs is used in the second conductive type contact layer for the transparent electrode; therefore, a problem arises wherein the light emitting output is reduced. In addition, it is necessary to heat the substrate in order to form the ITO film and the rate of the growth of the film thereof is low; therefore, a problem arises wherein it is costly and time consuming to manufacture such a light emitting diode.

SUMMARY OF THE INVENTION

It is therefore an object of the present invention to provide a light emitting diode with high luminance and improved productivity.

The present inventors have diligently carried out research in order to solve the above problems and, as a result, have discovered that in a light emitting diode having, at least, an AlGaInP light emitting layer and a transparent electrode, the transparent electrode is made of a ZnO film doped with a group III element or a compound thereof, and thereby a light emitting diode with high luminance and improved productivity can be provided wherein a low resistivity can be attained for allowing the diode to be used as a stable device leading to the completion of the present invention.

Thus, according to the present invention, provided is a light emitting diode having, at least, an AlGaInP light emitting layer and a transparent electrode, wherein the transparent element is made of a ZnO film doped with a group III element or a compound thereof.

BRIEF DESCRIPTION OF THE DRAWINGS

FIGS. 2A and 2B are schematic views of a light emitting diode (first embodiment) of the present invention, wherein FIG. 1A is a schematic cross-sectional view of the light emitting diode in the process of manufacturing, and FIG. 2B is a schematic cross-sectional view of the completed device;

FIGS. 3A and 3B are schematic views of a light emitting diode (second embodiment) of the present invention, wherein FIG. 3A is a schematic cross-sectional view of the light emitting diode in the process of manufacturing, and FIG. 3B is a schematic cross-sectional view of the completed device;

FIGS. 4A and 4B are schematic views of a light emitting diode (third embodiment) of the present invention, wherein FIG. 4A is a schematic cross-sectional view of the light emitting diode in the process of manufacturing, and FIG. 4B is a schematic cross-sectional view of the completed device.

DETAILED DESCRIPTION OF THE PREFERRED EMBODIMENTS

A light emitting diode according to the present invention has, at least, an AlGaInP light emitting layer and a transparent electrode, wherein the transparent electrode is made of a ZnO film doped with a group III element or a compound thereof.

In the following, although the configuration of the light emitting diode and manufacturing method thereof according to the present invention will be concretely described based on first to third embodiments, the present invention is not limited to these embodiments described herein.

First Embodiment

Figure 1:
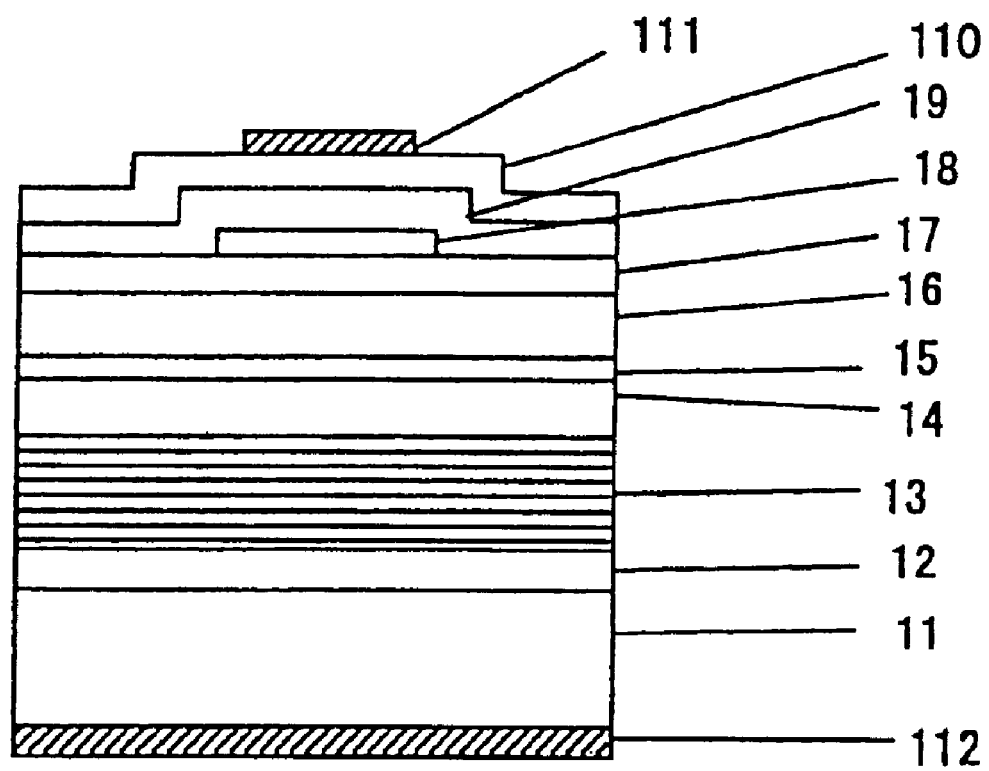
FIG. 1 is a schematic cross-sectional view showing an example of a conventional light emitting diode.
Figure 2A:
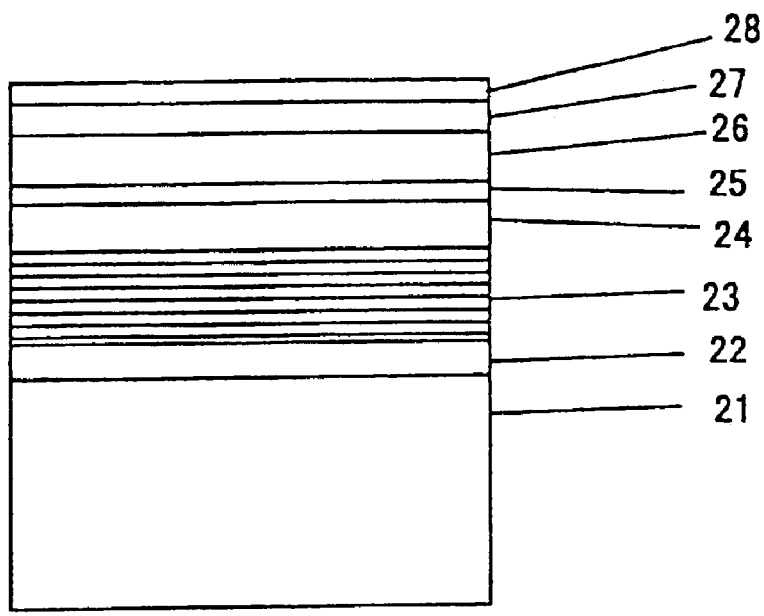
Figure 2B:
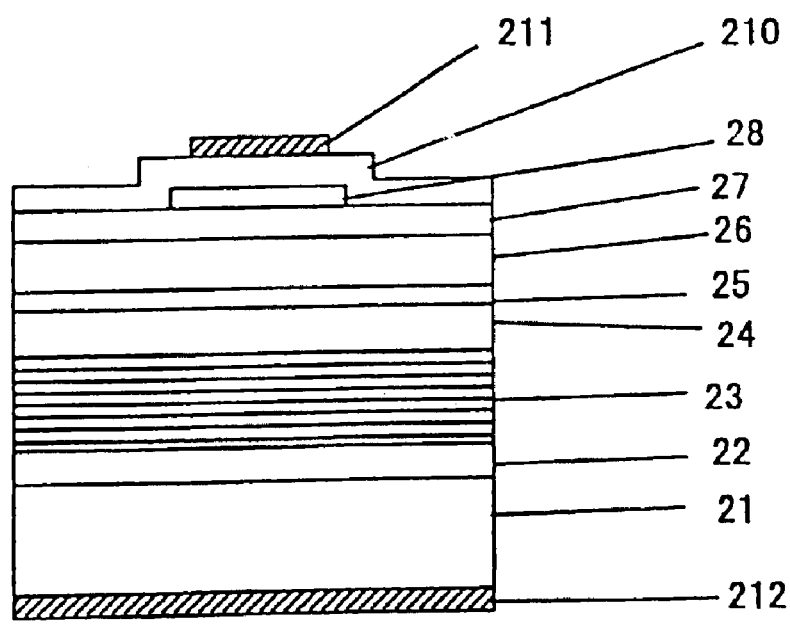

FIGS. 2A and 2B are schematic views of a light emitting diode (first embodiment) of the present invention, wherein FIG. 2A is a schematic cross-sectional view showing the light emitting diode in the process of manufacturing, and FIG. 2B is a schematic cross-sectional view showing the completed device. Concerning reference numerals in the figures, 21 indicates a first conductive type substrate, 22 indicates a first conductive type buffer layer, 23 indicates a first conductive type DBR layer, 24 indicates a first conductive type clad layer, 25 indicates a second conductive type light emitting layer, 26 indicates a second conductive type clad layer, 27 indicates a second conductive type contact layer for a transparent electrode, 28 indicates a first conductive type current blocking layer, 210 indicates a first conductive type transparent electrode, 211 indicates an electrode for wire bonding, and 212 indicates a lower layer electrode.

The light emitting diode of the first embodiment can be manufactured as follows.

First, the n-type GaAs buffer layer 22, the n-type DBR film 23 as a reflective film, the n-type AlInP first clad layer 24, the p-type AlGaInP light emitting layer 25, the p-type AlInP second clad layer 26, the p-type GaP contact layer 27 and the n-type GaP current blocking layer 28 are sequentially formed on the n-type GaAs substrate 21 in accordance with a well known method such as an MOCVD (Metal Organic Chemical Vapor Deposition) method (see FIG. 2A).

Although there is no specific limitation for the first conductive type substrate 21, an n-type GaAs substrate having a plane direction inclined from the surface (100) in the direction <011> by 15° is particularly preferable.

In addition, the film thicknesses of the respective films may be appropriately set according to the configuration of the light emitting diode, and in the first embodiment, for example, the n-type GaAs buffer layer 22 has a thickness of 0.5 $\mu$m, the n-type DBR film 23 has a thickness of 0.1 $\mu$m, the n-type AlInP first clad layer 24 has a thickness of 1 $\mu$m, the p-type AlGaInP light emitting layer 25 has a thickness of 1 $\mu$m, the p-type AlInP second clad layer 26 has a thickness of 1 $\mu$m, the p-type GaP contact layer 27 has a thickness of 300 Å and the n-type GaP current blocking layer 28 has a thickness of 300 Å.

Next, after the n-type GaP current blocking layer 28 is patterned in accordance with a well-known method such as photo etching, a ZnO film is formed so as to have a film thickness of approximately 0.1 $\mu$m to 0.2 $\mu$m as the first conductive type transparent electrode 210 in accordance with a well-known method such as a spattering method and Au is deposited thereon so as to have a film thickness of approximately 0.5 $\mu$m to 1.0 $\mu$m in accordance with a well-known method such as a vapor deposition method, so that this is patterned in accordance with a well-known method such as photo etching, thereby obtaining the electrode 211 for wire bonding.

In addition, after the first conductive type substrate 21 is polished to a thickness of approximately 100 $\mu$m in accordance with a well-known method such as back-grinding, an AuGe film is formed so as to have a film thickness of approximately 0.1 $\mu$m to 0.5 $\mu$m as the n-side electrode 212 in accordance with a well-known method such as a vapor deposition method and the substrate is scribed and divided so as to obtain a device such as that shown in FIG. 2B.

The transparent electrode of the light emitting diode according to the present invention is made of a ZnO film doped with a group III element or a compound thereof, and such a configuration provides the light emitting diode with a low resistivity in order that the diode can be used as a stable device with high luminance and improved productivity.

It is preferable for the group III element or the compound thereof to be selected from Ga, Al, In and compounds thereof. Such a configuration is preferable because the transparent electrode exhibits a more stable low resistance. Examples of the compounds thereof include oxides such as $Ga_2O_3$, $Al_2O_3$ and $In_2O_3$, and $Ga_2O_3$ is particularly preferable.

In addition, the amount of the group III element or the compound thereof to be doped is preferably 1 wt % to 10 wt % in ZnO, and examples of the amount include 1 wt %, 2 wt %, 3 wt %, 4 wt %, 4.5 wt %, 5 wt %, 5.5 wt %, 6 wt %, 7 wt %, 8 wt %, 9 wt %, 10 wt %. The amount is preferably 3 wt % to 8 wt %, and more preferably 5 wt % to 7 wt %. Such a configuration is preferable because the transparent electrode comes to have a more stable, low resistance.

According to the experiment carried out by the present inventors, in the case where 2.0 wt %, 6.0 wt % and 10.0 wt % of $Ga_2O_3$ are doped with ZnO, the resistivities of these become $1.5 \times 10^{-3}$ $\Omega \cdot cm^{-1}$, $5.0 \times 10^{-4}$ $\Omega \cdot cm^{-1}$ and $1.0 \times 10^{-3}$ $\Omega \cdot cm^{-1}$, respectively. Thus, it is understood that the resistivity depends on the amount of the group III elements or the compounds thereof to be doped, and that 5 wt % to 7 wt % is preferred.

Although the doping method depends on a method for forming a transparent electrode, a method can for example be cited, wherein a compressed powder body made of a mixture of ZnO and metal powder of a group III element, or of an oxide thereof, is used as a spattering target. In addition, the spattering target may be in a form of a compound oxide.

In the first embodiment, 5.7 wt % of $Ga_2O_3$ which is a compound of a group III element is doped with the ZnO film of the first conductive type transparent electrode 210, thereby attaining a good result.

It is preferable for the light emitting diode of the present invention to have a contact layer between the AlGaInP light emitting layer and the transparent electrode such as the first embodiment, and it is preferable for the contact layer to be selected from a GaP film, an InGaP film and an $(Al_xGa_{1-x})_yIn_{1-y}P$ film of which the Al mixed crystal ratio (x) and the In mixed crystal ratio (1-y) are both 0.05 or less. Such a configuration allows a device to have good contact between the light emitting layer and the transparent electrode. The GaP film among the above compounds is transparent. It is possible to form the ZnO film at room temperature, wherein the growth rate of the film is fast and, in addition, the cost of the ZnO film can be made lower than that of the ITO film; therefore, the ZnO film is particularly preferable.

It is preferable for the contact layer to be doped with Zn at a concentration of approximately $10^{18}$ cm$^{-3}$ to $10^{19}$ cm$^{-3}$ in view of reduction in the contact resistance with the transparent electrode. Although Zn is doped in the GaP film of the contact layer at a high concentration of $10^{19}$ cm$^{-3}$ in the first embodiment, the Zn diffusion to the light emitting layer is suppressed without negatively affecting light emission because the film thickness is as small as 300 Å.

Figure 5:
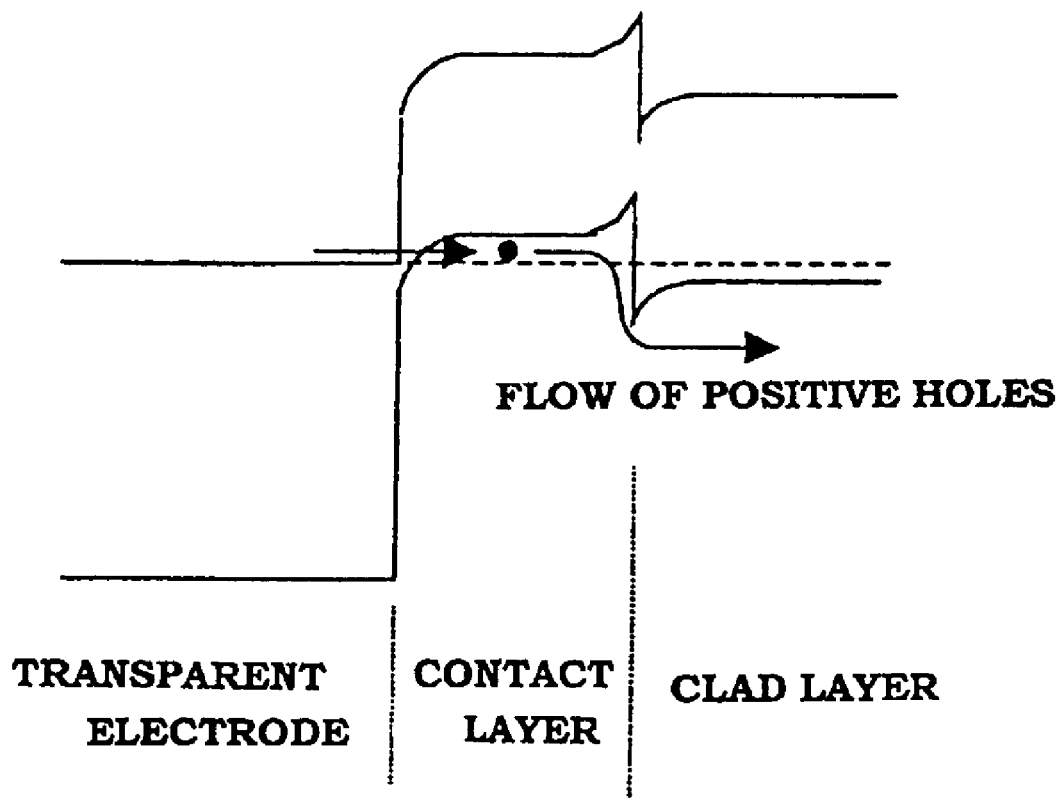
FIG. 5 is a band diagram of a first conductive type transparent electrode and a contact layer of a light emitting diode of the present invention.

In addition, Zn in the transparent electrode diffuses into the contact layer so that the contact layer becomes of p-type high concentration and this is preferable because the contact resistance between the transparent electrode and the contact layer can be further reduced. FIG. 5 is a band diagram of the first conductive type transparent electrode and the contact layer of the light emitting diode of the present invention. As shown in FIG. 5, positive holes flow from the first conductive type transparent electrode to the second conductive type contact layer due to the tunnel effect.

The film thickness of the contact layer is preferably 100 Å to 500 Å, and more preferably 200 Å to 300 Å. In the case where the film thickness of the contact layer is within the above range, the dopant diffusion from the contact layer to the lower layer, which affects the light emitting characteristics and lowers the efficiency of light emission, can be suppressed.

It is preferable for the light emitting diode of the present invention to have a current blocking layer of the opposite conductive type that is laminated on a portion of the contact layer. Such a configuration can prevent the emitted light from being blocked by an electrode for bonding which will be described later.

The electrode for wire bonding is smaller in size than the current blocking layer; therefore, light can be emitted highly efficiently without being absorbed by the electrode for wire bonding.

It is preferable for the light emitting diode of the present invention to have a metal electrode (electrode for wire bonding) that makes Schottky contact on a portion of the contact layer. Such a configuration can prevent light emission beneath the electrode for wire bonding.

It is preferable for the light emitting diode of the present invention to have a transparent electrode and a contact layer of which the contact resistance is reduced by means of annealing. That is, Zn or a doped group III element in the transparent electrode diffuses into the contact layer due to annealing, and thereby the carrier concentration in the contact layer is increased so as to reduce the contact resistance; therefore, the transparent electrode and the contact layer can make good contact to each other. In addition, the amount of dopant can be reduced at the time of formation of the contact layer so that the diffusion of the dopant into the lower layer can be suppressed.

Annealing can be carried out after the formation of the transparent electrode under the condition of, for example, 500° C., for 30 minutes or longer in the vacuum or in a nitrogen atmosphere.

Second Embodiment

Figure 3A:
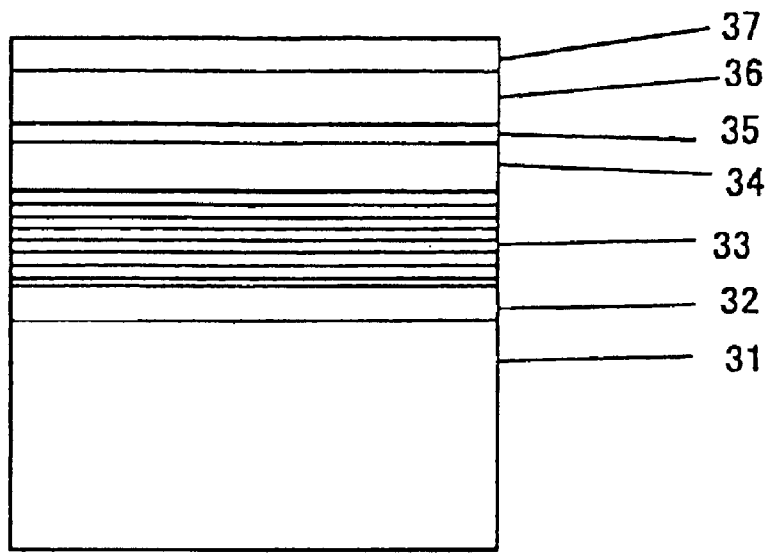
Figure 3B:
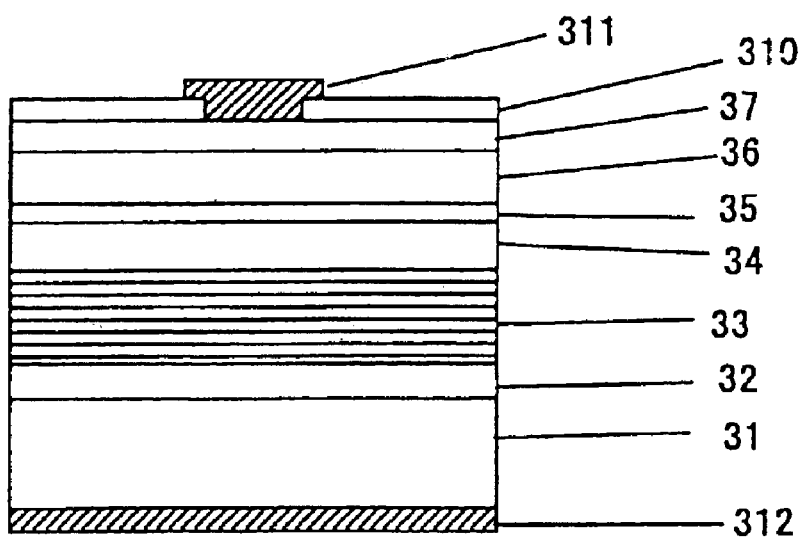

FIGS. 3A and 3B are schematic views of a light emitting diode (second embodiment) of the present invention, wherein FIG. 3A is a schematic cross-sectional view of the light emitting diode in the process of manufacturing, and FIG. 3B is a schematic cross-sectional view of the completed device. As for the reference numerals in the figures, 31 indicates a first conductive type substrate, 32 indicates a first conductive type buffer layer, 33 indicates a first conductive type DBR layer, 34 indicates a first conductive type clad layer, 35 indicates a second conductive type light emitting layer, 36 indicates a second conductive type clad layer, 37 indicates a second conductive type contact layer for a transparent electrode, 310 indicates a first conductive type transparent electrode, 311 indicates an electrode for wire bonding and 312 indicates a lower layer electrode.

The light emitting diode of the second embodiment can be manufactured as follows.

First, the n-type GaAs buffer layer 32, the n-type DBR film 33 as a reflective film, the n-type AlInP first clad layer 34, the p-type AlGaInP light emitting layer 35, the p-type AlInP second clad layer 36 and the p-type GaP contact layer 37 are sequentially formed on the n-type GaAs substrate 31 in accordance with a well-known method such as an MOCVD (Metal Organic Chemical Vapor Deposition) method (see FIG. 3A).

Next, a ZnO film is formed as the first conductive type transparent electrode 310 so as to have a film thickness of approximately 0.1 $\mu$m to 0.2 $\mu$m in accordance with a well-known method such as a spattering method; the second conductive type contact layer 37 for the transparent electrode is exposed by means of patterning and Au is deposited thereon so as to have a film thickness of approximately 0.5 $\mu$m to 1.0 $\mu$m in accordance with a well-known method such as a deposition method; and this is patterned in accordance with a well-known method such as photo etching so as to obtain the electrode 311 for wire bonding.

In addition, after the first conductive type substrate 21 has been polished so as to have a thickness of approximately 100 $\mu$m in accordance with a well-known method such as back-grinding, an AuGe film is formed as the n-side electrode 312 so as to have a film thickness of approximately 0.1 $\mu$m to 0.5 $\mu$vm in accordance with a well-known method such as a deposition method, and then the substrate is scribed and divided so as to obtain a device such as that shown in FIG. 3B.

It is preferable for the transparent electrode of the light emitting. diode of the present invention to be doped with a group III element or a compound thereof, and to be further doped with a transient element other than the group III element, or a compound thereof. Such a configuration increases the controllability of the chemical characteristics of the transparent electrode so as to facilitate its patterning, and reduces the light absorption of the transparent electrode so as to increase the efficiency of the light emission thereof. That is, such a configuration increases the resistance of the transparent electrode to acids and alkalines while maintaining its low resistivity, and thereby the problems of etching being carried out at too high a rate and poor controllability can be alleviated so that the pattern can be stably formed.

It is preferable for the transient element other than the group III element or a compound thereof to be selected from Cr, Co, V and compounds thereof. Examples of the compounds include oxides such as $CrO_2$, CoO and VO, and $CrO_2$ is particularly preferable.

In addition, the amount of the transient element other than the group III element or a compound thereof to be doped is preferably 1 wt % to 5 wt % as relative to ZnO, and examples of the amount include 1 wt %, 2 wt %, 2.5 wt %, 3 wt %, 3.5 wt %, 4 wt %, 5 wt %, and more preferably 2 wt % to 4 wt %.

According to the experiment carried out by the present inventors, in the case where $CrO_2$ is not doped, the etching rate when HCl is used is 10 nm/sec or greater, while in the case where 1 wt % and 3 wt % of $CrO_2$ are doped, the etching rates thereof become 8 nm/sec and 7 nm/sec, respectively, exhibiting excellent controllability. In addition, the resistivity increases when the amount of the dopant increases and the resistivity becomes $5.0 \times 10^{-4}$ $\Omega \cdot cm^{-1}$, $6.0 \times 10^{-4}$ $\Omega \cdot cm^{-1}$ and $9.0 \times 10^{-4 \Omega \cdot cm-1}$, in the case where 1 wt %, 3 wt % and 5 wt % of $Ga_2O_3$ are doped with ZnO, respectively. Thus, it is understood that the resistivity depends on the amount of dopant of the transient elements other than group III elements or compounds thereof, and that 2 wt % to 3 wt % is preferred.

A good result is attained in the second embodiment by doping 5.7 wt % of $Ga_2O_3$ as relative to ZnO, and 3.0 wt % of $CrO_2$ as relative to ZnO, into the ZnO film of the first conductive type transparent electrode 310 as a group III element or a compound thereof.

The electrode for wire bonding makes ohmic contact with the ZnO film of the transparent electrode and makes Schottky contact with the GaP contact layer so that no current flows beneath the electrode for wire bonding; therefore, the amount of emitted light that is absorbed by the electrode for wire bonding can be reduced, thus enhancing the efficiency of light emission.

Third Embodiment

Figure 4A:
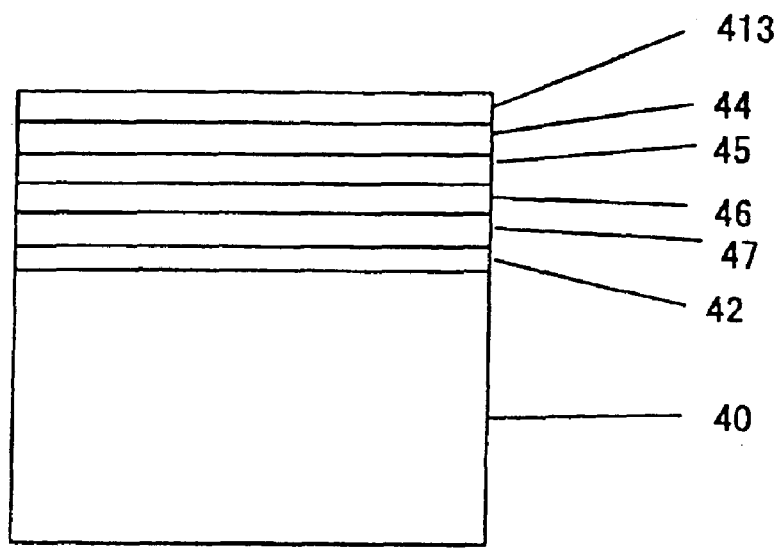
Figure 4B:
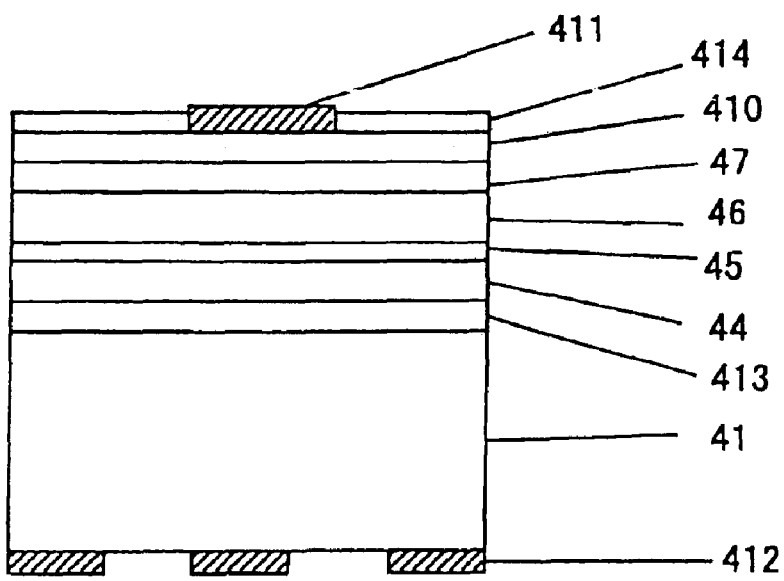

FIGS. 4A and 4B are schematic views of a light emitting diode (third embodiment) of the present invention, wherein FIG. 4A is a schematic cross-sectional view of the light emitting diode in the process of manufacturing, and FIG. 4B is a schematic cross-sectional view of the completed device. As for the reference numerals in the figures, 40 indicates a second conductive type substrate, 42 indicates a second conductive type buffer layer, 47 indicates a second conductive type contact layer for a transparent electrode, 46 indicates a second conductive type clad layer, 45 indicates a second conductive type light emitting layer, 44 indicates a first conductive type clad layer, 413 indicates a first conductive type contact layer for direct junction, 41 indicates a first conductive type substrate, 410 indicates a first conductive type transparent electrode, 411 indicates an electrode for wire bonding, 412 indicates a lower layer electrode and 414 indicates a protective film.

The light emitting diode of the third embodiment can be manufactured as follows.

First, the p-type GaAs buffer layer 42, the p-type InGaP contact layer 47, the p-type AlInP second clad layer 46, the p-type AlGaInP light emitting layer 45, the n-type AlInP first clad layer 44, and the n-type GaP contact layer 413 are sequentially formed on the p-type GaAs substrate 40 in accordance with a well-known method such as an MOCVD (Metal Organic Chemical Vapor Deposition) method (see FIG. 4A).

Next, after the n-type GaP contact layer 413 and the n-type GaP substrate 41 have directly been joined in the obtained lamination in accordance with a well-known method such as a direct junction method under high temperature and high pressure, the p-type GaAs substrate 40 and the p-type GaAs buffer layer 42 are removed in accordance with a well-known method such as etching. Next, a ZnO film (5.7 wt % of $Ga_2O_3$ as relative to ZnO and 3.0 wt % of $CrO_2$ as relative to ZnO are doped with ZnO) is formed as the first conductive type transparent electrode 410 so as to have a film thickness of approximately 0.1 μm to 0.2 μm in accordance with a well-known method such as a spattering method; Au is deposited thereon so as to have a film thickness of approximately 0.5 μm to 1.0 μm in accordance with a well-known method such as a vapor deposition method; and this is patterned in accordance with a well-known method such as photo-etching so as to obtain the electrode 41 1 for wire bonding. Then, the $SiO_2$ film 414 is formed on the transparent electrode in accordance with a well-known method such as a spattering method.

In addition, an AuGe film is formed as the n-side electrode 212 so as to have a film thickness of approximately 0.1 μm to 0.5 μm in accordance with a well-known method such as a vapor deposition method, and the substrate is scribed and divided so as to obtain a device such as that shown in FIG. 4B.

Light emitted from the AlGaInP light emitting layer 45 passes through the GaP substrate 41; therefore, it is possible for the light to be emitted from the GaP substrate 41 side, as well as from the first conductive type transparent electrode 410 side, and the light emitting diode having such a configuration allows for highly efficient light emission.

In addition, the reliability of the element can be increased in regard to resistance to humidity and the like by providing a protective film on the first conductive type transparent electrode 410. The same effects can be gained by using a film having a high resistance to humidity such as $TiO_2$ and ITO in place of $SiO_2$.

The present invention can provide a light emitting diode with high luminance and improved productivity.

What is claimed is:

1. A light emitting diode having, at least, an AlGaInP light emitting layer and a transparent electrode, wherein the transparent electrode is made of a ZnO film doped with a group III element or a compound thereof and the amount of the group III element or a compound thereof to be doped is 1 wt % to 10 wt % as relative to ZnO.

2. The light emitting diode according to claim 1, wherein the group III element or a compound thereof is selected from Ga, Al, In and compounds thereof.

3. The light emitting diode according to claim 1, wherein the amount of the group III element or a compound thereof to be doped is 1 wt % to 10 wt % as relative to ZnO.

4. The light emitting diode according to claim 1, wherein the ZnO film is additionally doped with a transient element other than the group III element, or a compound thereof.

5. The light emitting diode according to claim 1, wherein the light emitting diode has a contact layer between the AlGaInP light emitting layer and the transparent electrode, and the contact layer is selected from a GaP film, an InGaP film and an $(Al_xGa_{1-x})_yIn_{1-y}P$ film of which the Al mixed crystal ratio (x) and the In mixed crystal ratio (1-y) are both 0.05 or less.

6. The light emitting diode according to claim 5, wherein the contact layer has a film thickness of 100 Å to 500 Å.

7. The light emitting diode according to claim 6, wherein the contact layer has a film thickness of 200 Å to 300 Å.

8. The light emitting diode according to claim 5, wherein the light emitting diode has a current blocking layer of the opposite conductive type that is laminated on a portion of the contact layer.

9. The light emitting diode according to claim 5, wherein the light emitting diode has a metal electrode that makes Schottky contact with a portion of the contact layer.

10. The light emitting diode according to claim 5, wherein the light emitting diode has the transparent electrode and the contact layer that provide for reduction in the contact resistance between the transparent electrode and the contact layer by means of annealing.

* * * * *